(12) United States Patent
Seki et al.

(10) Patent No.: US 9,775,202 B2
(45) Date of Patent: Sep. 26, 2017

(54) LIGHTING APPARATUS AND LUMINAIRE THAT ADJUST SWITCHING FREQUENCY BASED ON OUTPUT VOLTAGE

(71) Applicant: Panasonic Intellectual Property Management Co., Ltd., Osaka (JP)

(72) Inventors: Keisuke Seki, Osaka (JP); Takeshi Kamoi, Kyoto (JP); Daisuke Yamahara, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 14/824,590

(22) Filed: Aug. 12, 2015

(65) Prior Publication Data
US 2016/0066375 A1    Mar. 3, 2016

(30) Foreign Application Priority Data

Aug. 27, 2014  (JP) ................................. 2014-173116

(51) Int. Cl.
| | |
|---|---|
| *H05B 33/08* | (2006.01) |
| *H01L 29/16* | (2006.01) |
| *H02M 1/42* | (2007.01) |
| *H02M 3/335* | (2006.01) |

(52) U.S. Cl.
CPC ..... *H05B 33/0815* (2013.01); *H01L 29/1608* (2013.01); *H02M 1/42* (2013.01); *H02M 3/33523* (2013.01); *H05B 33/0812* (2013.01); *H05B 33/0851* (2013.01); *H05B 33/0896* (2013.01)

(58) Field of Classification Search
CPC ............ H05B 33/0875; H05B 33/0887; H05B 33/0815; H05B 33/0851; H05B 33/0839
See application file for complete search history.

(56) References Cited

U.S. PATENT DOCUMENTS

| | | |
|---|---|---|
| 8,749,149 B2 | 6/2014 | Naruo et al. |
| 8,823,278 B2 | 9/2014 | Iwai et al. |
| 8,860,319 B2 | 10/2014 | Naruo |
| 2012/0056560 A1 | 3/2012 | Iwai et al. |
| 2012/0217873 A1 | 8/2012 | Tanaka |

(Continued)

FOREIGN PATENT DOCUMENTS

| | | |
|---|---|---|
| EP | 2 519 079 A1 | 10/2012 |
| JP | 2011-100666 A | 5/2011 |

(Continued)

*Primary Examiner* — Tung X Le
*Assistant Examiner* — Raymond R Chai
(74) *Attorney, Agent, or Firm* — Renner Otto Boisselle & Sklar, LLP

(57) ABSTRACT

Lighting apparatus which supplies a current to solid-state light-emitting device (LED) includes: DC power supply circuit (AC/DC converter); and DC/DC converter that converts an output voltage of DC power supply circuit and applies, to solid-state light-emitting device, the output voltage converted. DC/DC converter includes: switching element; and DC/DC control circuit that performs a control of repeatedly turning ON and OFF switching element in a boundary conduction mode, and DC power supply circuit adjusts the output voltage to make a switching frequency of switching element higher than a first frequency, based on a forward voltage to be applied to solid-state light-emitting device.

6 Claims, 13 Drawing Sheets

(56) References Cited

U.S. PATENT DOCUMENTS

| | | | |
|---|---|---|---|
| 2012/0242235 A1 | 9/2012 | Naruo et al. | |
| 2012/0242246 A1 | 9/2012 | Naruo | |
| 2012/0248998 A1 | 10/2012 | Yoshinaga | |
| 2013/0026937 A1 | 1/2013 | Nakajo et al. | |
| 2013/0201729 A1* | 8/2013 | Ahsanuzzaman | H02M 3/33507 363/21.12 |
| 2013/0329468 A1* | 12/2013 | Yang | H02M 3/33523 363/21.15 |
| 2014/0285092 A1* | 9/2014 | Knoedgen | H05B 37/0272 315/151 |
| 2015/0028778 A1* | 1/2015 | Zudrell-Koch | H05B 33/0851 315/308 |
| 2015/0048807 A1* | 2/2015 | Fan | H02M 1/42 323/208 |
| 2015/0257215 A1* | 9/2015 | Kang | H05B 33/0815 315/186 |
| 2016/0057825 A1* | 2/2016 | Hu | H05B 33/0815 315/201 |

FOREIGN PATENT DOCUMENTS

| | | |
|---|---|---|
| JP | 2012-049273 A | 3/2012 |
| JP | 2012-199002 A | 10/2012 |
| JP | 2012-199392 A | 10/2012 |
| JP | 2012-204289 A | 10/2012 |
| JP | 2012-204360 A | 10/2012 |
| JP | 2012-216766 A | 11/2012 |
| JP | 2013-030416 A | 2/2013 |
| JP | 2013-229407 A | 11/2013 |
| JP | 2014-022067 A | 2/2014 |

* cited by examiner

LIGHTING APPARATUS AND LUMINAIRE THAT ADJUST SWITCHING FREQUENCY BASED ON OUTPUT VOLTAGE

CROSS REFERENCE TO RELATED APPLICATION

This application claims the benefit of priority of Japanese Patent Application Number 2014-173116, filed Aug. 27, 2014, the entire content of which is hereby incorporated by reference.

BACKGROUND OF THE INVENTION

1. Field of the Invention

The present disclosure relates to a lighting apparatus which supplies a current to a solid-state light-emitting device, and a luminaire including the lighting apparatus.

2. Description of the Related Art

As a lighting apparatus which supplies a current to a solid-state light-emitting device such as an LED (light-emitting diode), an apparatus which includes an AC/DC converter and a DC/DC converter connected to the AC/DC converter has been proposed (see, for example, Japanese Unexamined Patent Application Publication No. 2013-30416).

In the lighting apparatus according to Japanese Unexamined Patent Application Publication No. 2013-30416, the DC/DC converter includes a chopper circuit having a switching element that switches (turns ON and OFF repeatedly) in BCM (boundary conduction mode), an inductor, etc. It is to be noted that the BCM is an operation mode in which a switching element is turned ON when a current flowing through the inductor reaches zero in switching of the DC/DC converter. A DC/DC converter of this type keeps an output current constant by varying an ON time, which is a period of time during which an ON state of the switching element is maintained, depending on at least a forward voltage to be provided to the solid-state light-emitting device connected.

SUMMARY OF THE INVENTION

In the lighting apparatus according to Japanese Unexamined Patent Application Publication No. 2013-30416, an OFF time, which is a period of time during which an OFF state of the switching element is maintained, also varies depending on at least a forward voltage. The ON time and OFF time are calculated analytically. A switching frequency fsw, which is an inverse number of a sum of the ON time and OFF time, is represented by Expression 1 below.

$$Fsw = Vf(Vdc - Vf)/2IoutLVdc \qquad \text{(Expression 1)}$$

Here, Iout denotes an output current of the DC/DC converter. L denotes inductance of an inductor included in the DC/DC converter. Vdc denotes a DC voltage provided to the DC/DC converter. Vf is a forward voltage applied to a solid-state light-emitting device connected to an output terminal of the DC/DC converter.

As shown in the above-described Expression 1, the switching frequency fsw varies depending on at least a forward voltage. Thus, when a switching frequency fsw decreases and enters an audible frequency band, the lighting apparatus may cause sounding. In addition, when a variation range of the switching frequency increases, a noise filter which is used for suppressing noise caused by switching has to be capable of suppressing a wider range of frequency band. In order to suppress noise of a wider range of frequency band, a noise filter of a greater size has to be used, which causes an increase in costs for the noise filter. Although it is possible to design a circuit to have a higher switching frequency for addressing the sounding problem, this causes an increased switching loss, decreased circuit efficiency, and increased heat production.

In order to solve the above-described conventional problem, an object of the present disclosure is to provide a lighting apparatus and the like which are capable of suppressing variation in switching frequency of the DC/DC converter.

In order to achieve the above-described object, the lighting apparatus according to an aspect of the present disclosure is a lighting apparatus which supplies a current to a solid-state light-emitting device, the lighting apparatus including: a direct-current (DC) power supply circuit; and a DC/DC converter that converts an output voltage of the DC power supply circuit and applies, to the solid-state light-emitting device, the output voltage converted, wherein the DC/DC converter includes a switching element, and a control circuit that performs a control of repeatedly turning ON and OFF the switching element in a boundary conduction mode, and the DC power supply circuit adjusts the output voltage to make a switching frequency of the switching element higher than a first frequency, based on a forward voltage to be applied to the solid-state light-emitting device.

With the present disclosure, a lighting apparatus and the like which are capable of suppressing variation in switching frequency of the DC/DC converter is provided.

BRIEF DESCRIPTION OF DRAWINGS

The figures depict one or more implementations in accordance with the present teaching, by way of examples only, not by way of limitations. In the figures, like reference numerals refer to the same or similar elements.

DETAILED DESCRIPTION OF THE PREFERRED EMBODIMENTS

The following describes in detail a lighting apparatus and a luminaire according to an aspect of the present disclosure, with reference to the drawings.

It is to be noted that embodiments described below each indicate one specific example of the present disclosure. Numerical values, constituent elements, the arrangement and connection of the constituent elements, and so on shown in the following embodiments are mere examples, and therefore do not limit the scope of the present disclosure. In addition, among the constituent elements in the following embodiments, elements not recited in any one of the independent claims which indicate the broadest concepts of the present disclosure are described as arbitrary constituent elements.

It is to be noted that each diagram is a schematic diagram, and does not necessarily depict the actual structure. Furthermore, in each diagram, substantially the same elements are assigned with the same reference signs, and description is omitted or simplified when overlapping.

Embodiment 1

[1-1. Configuration of Entire Lighting Apparatus]

First, configuration of an entire lighting apparatus according to Embodiment 1 will be described.

Figure 1:
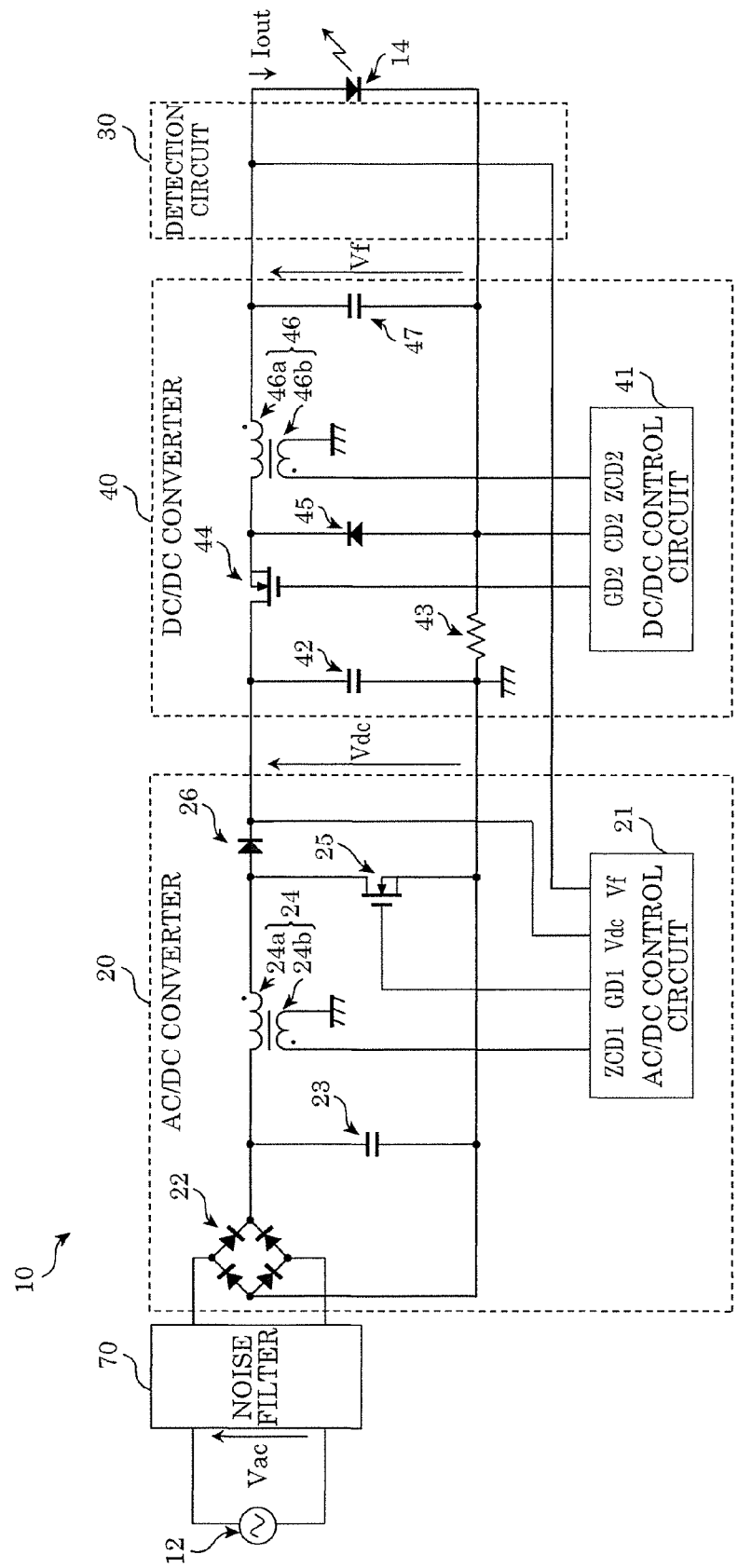
FIG. 1 is a circuit diagram illustrating a circuit configuration of a lighting apparatus according to Embodiment 1.

FIG. 1 is a circuit diagram illustrating a circuit configuration of lighting apparatus 10 according to Embodiment 1. FIG. 1 also illustrates AC power supply 12 (a commercial power supply, for example) which generates an AC voltage provided to lighting apparatus 10, and LED 14 which is an example of a solid-state light-emitting device to which a current output from lighting apparatus 10 is supplied.

As illustrated in FIG. 1, lighting apparatus 10 is an apparatus which supplies a current (output current Iout) to LED 14, and includes AC/DC converter 20, detection circuit 30, DC/DC converter 40, and noise filter 70.

AC/DC converter 20 is a boost chopper type DC power source circuit which converts an alternating-current (AC) voltage to a direct-current (DC) voltage. AC/DC converter 20 converts AC voltage Vac, which is provided from AC power supply 12, to DC voltage Vdc, according to the present embodiment. AC/DC converter 20 includes: diode bridge 22; capacitor 23; inductor 24; switching element 25; diode 26; and AC/DC control circuit 21. Diode bridge 22 is a circuit which rectifies an AC voltage Vac provided to AC/DC converter 20. Capacitor 23 is an element which smoothes the voltage rectified by diode bridge 22. Inductor 24 is a choke coil. Inductor 24 includes: primary coil 24a which accumulates or releases energy in response to switching of switching element 25; and secondary coil 24b for detecting the state where a current flowing through primary coil 24a reaches zero (zero current). Switching element 25 is an element which switches (turns ON and OFF repeatedly) under the control of AC/DC control circuit 21, and is an NMOS transistor connected in series to primary coil 24a of inductor 24, according to the present embodiment. Diode 26 is included in a circuit loop together with inductor 24 and DC/DC converter 40, and is a rectifier which regenerates energy accumulated in primary coil 24a of inductor 24.

AC/DC control circuit 21 is a circuit which performs a control of repeatedly turning ON and OFF switching element 25 (causes switching element 25 to perform switching). When AC/DC control circuit 21 controls the ON time of switching element 25, a DC voltage Vdc output from AC/DC converter 20 is adjusted. AC/DC control circuit 21 according to the present embodiment has a feature of adjusting the output voltage Vdc based on a forward voltage Vf which is a voltage to be applied to LED 14 detected by detection circuit 30. As illustrated in FIG. 1, AC/DC control circuit 21 includes four terminals: terminal ZCD1; terminal GD1; terminal Vdc; and terminal Vf. Here, terminal ZCD1 is a terminal connected to secondary coil 24b of inductor 24. Furthermore, terminal GD1 is a terminal connected to a gate of switching element 25. Furthermore, terminal Vdc is a terminal to which an output voltage Vdc of AC/DC converter 20 is provided. Furthermore, terminal Vf is a terminal to which a forward voltage Vf is provided from detection circuit 30. AC/DC control circuit 21 detects a zero current using terminal ZCD1, detects that the output voltage Vdc reaches a predetermined reference voltage using terminal Vdc, and causes switching element 25 to switch using terminal GD1. It is to be noted that the predetermined reference voltage is a voltage corresponding to a target voltage for the output voltage Vdc. Detailed description on AC/DC control circuit 21 will be provided later.

Detection circuit 30 is a circuit for detecting a forward voltage Vf of the solid-state light-emitting device (LED 14) which is a load of lighting apparatus 10. Detection circuit 30 includes terminals, wirings, and so on for detecting a provided voltage to LED 14. Although detection circuit 30 which detects the provided voltage itself to LED 14 is used in the present embodiment, detection circuit 30 which detects a voltage obtained by dividing the provided voltage by two resistances may be used.

DC/DC converter 40 is a circuit which converts the output voltage Vdc of AC/DC converter 20 and applies, to a solid-state light-emitting device, the output voltage Vdc converted. In the present embodiment, DC/DC converter 40 is a buck converter which converts a DC voltage Vdc to a forward voltage Vf which is a DC voltage to be applied to LED 14. DC/DC converter 40 includes: capacitor 42; resistor 43; switching element 44; diode 45; inductor 46; capacitor 47; and DC/DC control circuit 41. Capacitor 42 is an element for smoothing a ripple of the DC voltage provided to DC/DC converter 40. Resistor 43 which is connected in series to switching element 44 is a sensing resistor for detecting a current flowing through switching element 44. Switching element 44 is an element which switches (turns ON and OFF repeatedly) under the control of DC/DC control circuit 41. Switching element 44 is an NMOS transistor connected in series to primary coil 46a of inductor 46, according to the present embodiment. Diode 45 is included in a circuit loop together with LED 14 and inductor 46, and is a rectifier which regenerates energy accumulated in primary coil 46a of inductor 46. Inductor 46 is a choke coil including: primary coil 46a which accumulates or releases energy in response to switching of switching element 44; and secondary coil 46b for detecting the state where a current flowing through primary coil 46a reaches zero (zero current). Capacitor 47 is connected in parallel to LED 14, and smoothes a ripple voltage which is generated in inductor 46 and diode 45.

DC/DC control circuit 41 is a circuit which performs a control of repeatedly turning ON and OFF switching element 44 (causes switching element 44 to perform switching) in BCM, and thus supplies LED 14 with a constant current (output current Iout). As illustrated in FIG. 1, DC/DC control circuit 41 includes three terminals (terminal GD2 connected to a gate of switching element 44, terminal CD2 connected to one end of resistor 43, and terminal ZCD2 connected to secondary coil 46b of inductor 46). DC/DC control circuit 41 detects a zero current using terminal ZCD2, detects that a current flowing through switching element 44 reaches a predetermined threshold using terminal CD2, and causes switching element 44 to perform switching using terminal GD2. It is to be noted that the predetermined threshold is a value that has been previously determined as a value corresponding to the output current Tout of lighting apparatus 10.

Noise filter 70 is a filter for suppressing leakage of high-frequency noise caused by switching operation performed by DC/DC converter 40 and so on to outside lighting apparatus 10. A circuit configuration of noise filter 70 will be described below with reference to FIG. 2.

Figure 2:
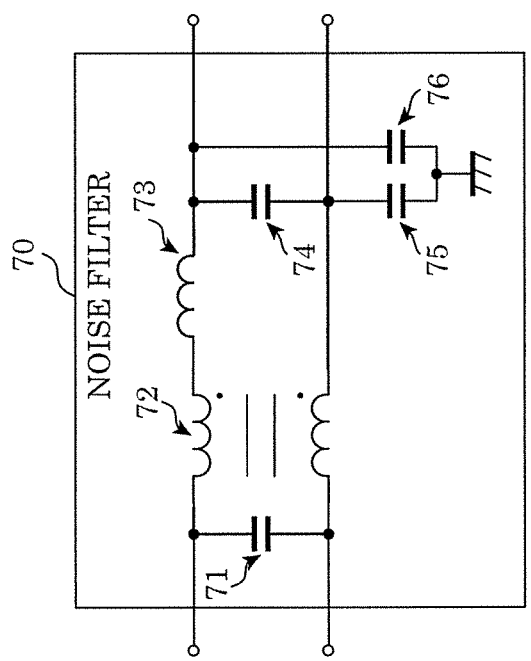
FIG. 2 is a circuit diagram illustrating a circuit configuration of a noise filter according to Embodiment 1.

FIG. 2 is a circuit diagram illustrating a circuit configuration of noise filter 70 according to the present embodiment.

As illustrated in FIG. 2, noise filter 70 includes capacitors 71, 74, 75, and 76, and inductors 72 and 73. Capacitor 71, capacitor 74, and inductor 73 of noise filter 70 form a normal mode filter. Furthermore, capacitor 75, capacitor 76, and inductor 72 of noise filter 70 form a common mode filter. In such a filter, a cut-off frequency of the filter is proportional to $(LC)^{-1/2}$, where L denotes inductance and C denotes capacitance in the filter. Accordingly, if a minimum operation frequency of DC/DC converter 40 can be made n-times for example, a constant of product of L and C of noise filter 70 can be made $1/n^2$, which leads to device miniaturization and cost reduction. Furthermore, reduction in the inductance L allows reducing the number of coils, which leads to higher efficiency in addition to miniaturization. Furthermore, reduction in the capacitance C allows reducing a reactive current, which leads to higher power factor. Although noise filter 70 is provided at an input side of lighting apparatus 10 in the present embodiment, it is sufficient that noise filter 70 be provided at least one of the input side and an output side (that is LED 14 side) of lighting apparatus 10. For example, provision of noise filter 70 at the output side of lighting apparatus 10 suppresses noise leakage to the solid-state light-emitting device which is a load of lighting apparatus 10. Furthermore, it is sufficient that noise filter 70 includes at least one of the normal mode filter and the common mode filter.

[1-2. AC/DC Control Circuit]

Next, detailed description is provided on AC/DC control circuit 21 which is a substantial part of lighting apparatus 10 according to the present embodiment.

Figure 3:
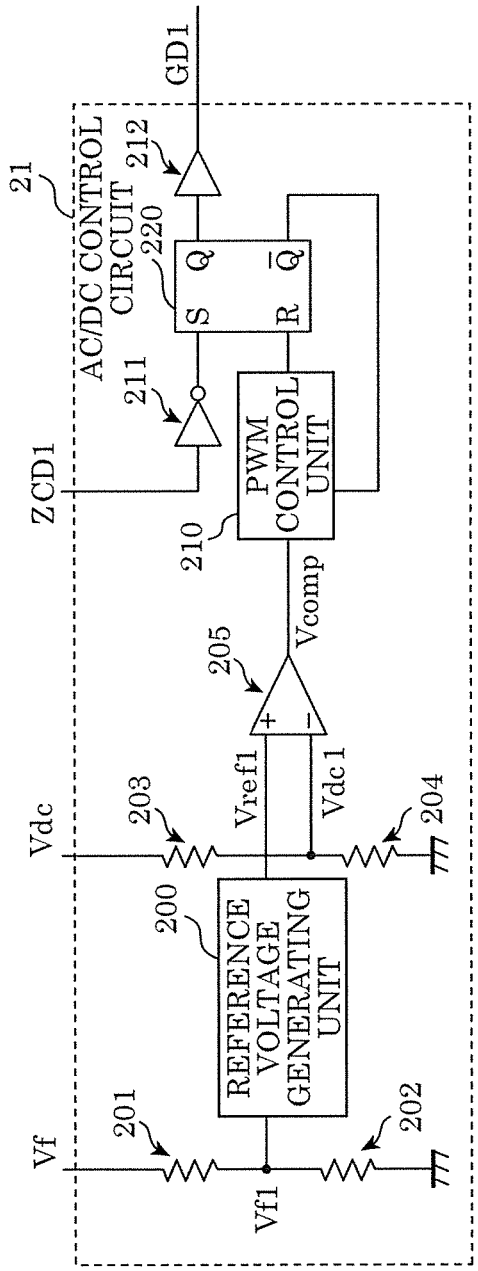
FIG. 3 is a circuit diagram illustrating a circuit configuration of an AC/DC control circuit according to Embodiment 1.

FIG. 3 is a circuit diagram illustrating a circuit configuration of AC/DC control circuit 21.

As illustrated in FIG. 3, AC/DC control circuit 21 includes: reference voltage generating circuit 200; resistors 201, 202, 203, and 204; error amplifier 205; flip-flop 220; logical negation circuit 211; amplifier 212; and PWM control unit 210. Resistors 201 and 202 are resistors for dividing the forward voltage Vf provided to terminal Vf. Resistors 203 and 204 are resistors for dividing the output voltage Vdc of AC/DC converter provided to terminal Vdc. Reference voltage generating unit 200 is a processing unit which receives a voltage Vf1 obtained by dividing the forward voltage Vf and generates a reference voltage Vref1 corresponding to the voltage Vf1. In the present embodiment, reference voltage generating unit 200 includes a microcomputer. The reference voltage Vref1 is provided to error amplifier 205 and compared with the voltage Vdc1 obtained by dividing the output voltage Vdc. Error amplifier 205 is an amplifier which compares the reference voltage Vref1 generated by reference voltage generating unit 200 and the voltage Vdc1 obtained by dividing the output voltage Vdc, and provides a voltage Vcomp obtained by amplifying the difference to PWM control unit 210. Flip-flop 220 is a circuit which generates a control signal to the gate of switching element 25. Logical negation circuit 211 is a circuit which outputs a high-level signal when a low-level signal is provided, and a low-level signal when a high-level signal is provided. Amplifier 212 is an amplifier which amplifies the signal output from terminal Q of flip-flop 220. Amplifier 212 amplifies the provided high-level signal to a signal having a voltage capable of turning switching element 25 to the ON state. PWM control unit 210 is a processing unit which outputs a reset signal after a low-level notQ signal is provided from flip-flop 220 and then a predetermined period, which is proportional to the voltage Vcomp provided from error amplifier 205, elapses. PWM control unit 210 may include, for example, one of a ramp generator with a comparator and a microcomputer.

With AC/DC control circuit 21 configured as above, switching element 25 is controlled to make the voltage Vdc1 obtained by dividing the output voltage Vdc of AC/DC converter 20 equal to the reference voltage Vref1 generated based on the forward voltage Vf.

[1-3. Operation of Lighting Apparatus]

Next, an operation performed by lighting apparatus 10 according to the present embodiment will be described.

First, description is provided on an outline of operation performed by DC/DC converter 40 of lighting apparatus 10 illustrated in FIG. 1.

Under the control of DC/DC control circuit 41, in DC/DC converter 40, switching element 44 repeatedly is ON for a predetermined ON time and then is OFF for a predetermined OFF time. The predetermined ON time and the predetermined OFF time are determined based on at least the forward voltage of LED 14 that is the load. Thus, switching element 44 switches in BCM. At this time, in the ON time of switching element 44, a current flows through LED 14, primary coil 46a of inductor 46, switching element 44, and resistor 43, and an inductor current flowing through primary coil 46a of inductor 46 increases. Meanwhile, in the OFF time of switching element 44, the energy accumulated in inductor 46 is released via diode 45, and thus a current flows through inductor 46, diode 45, and LED 14. As a result, the inductor current flowing through primary coil 46a of inductor 46 decreases. The switching performed by switching element 44 causes a current which has a saw-tooth shape (repetition of triangular waves) and a constant peak current value (the above-described predetermined threshold) flows through primary coil 46a of inductor 46.

In order to cause switching element 44 to operate in BCM, DC/DC control circuit 41 detects the state where the current flowing through primary coil 46a of inductor 46 reaches zero (zero current) according to a voltage provided to terminal ZCD2 connected to secondary coil 46b of inductor 46. Upon detecting the zero current, DC/DC control circuit 41 outputs a control signal for turning ON switching element 44 from terminal GD2. In addition, upon detecting that the current flowing through switching element 44 reaches the predetermined threshold according to a voltage provided to terminal CD2, DC/DC control circuit 41 outputs a control signal for turning OFF switching element 44 from terminal GD2.

Figure 4:
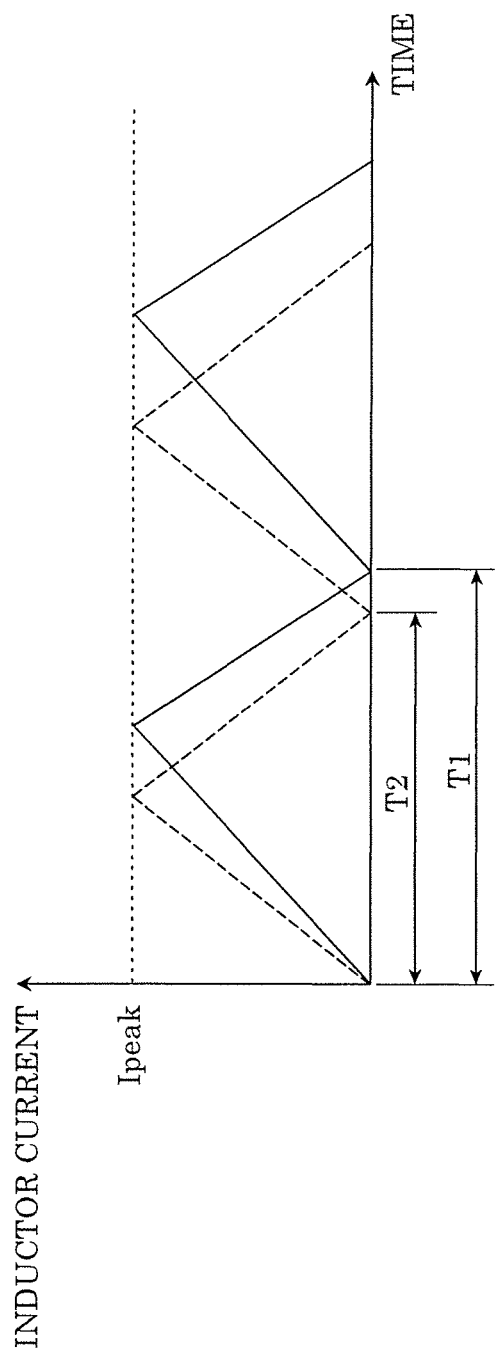
FIG. 4 is a graph illustrating an example of a waveform of an inductor current flowing through an inductor of a DC/DC converter according to Embodiment 1.

Here, description is provided on a waveform of the above-described inductor current and the switching frequency of switching element 44, with reference to FIG. 4.

FIG. 4 is a graph illustrating an example of a waveform of an inductor current flowing through inductor 46 of DC/DC converter 40. FIG. 4 illustrates waveforms of inductor currents with two different forward voltages.

As indicated by the solid line in FIG. 4, the inductor current has a saw-tooth shape waveform having cycle T1 and a predetermined threshold Ipeak as the peak current value. Meanwhile, in FIG. 4, the waveform indicated by the broken line indicates a waveform of an inductor current obtained when the forward voltage Vf is different from the case where the waveform of the inductor current indicated by the solid line is obtained. In the example indicated by the broken line in FIG. 4, in the same manner as in the case of the solid line, the peak current value of the inductor current is the threshold Ipeak. However, since the inductor current has a different inclination with respect to time due to a difference in forward voltage Vf, cycle T2 of the waveform of the inductor current in the example indicated by the broken line in FIG. 4 is different from cycle T1. Cycle T1 and cycle T2 are inverse numbers of the switching frequency fsw represented by Expression 1 above. As described above, the switching frequency fsw of switching element 44 is different depending on the forward voltage Vf of LED 14 connected.

Lighting apparatus 10 according to the present embodiment suppresses variation of the switching frequency fsw of switching element 44 included in DC/DC converter 40 depending on the forward voltage Vf. Since the switching frequency fsw is represented by Expression 1 above, the output voltage Vdc of AC/DC converter 20 is represented by Expression 2 below by transforming Expression 1 above.

$$Vdc = Vf^2/(Vf - 2fswLIout) \quad \text{(Expression 2)}$$

Here, Iout denotes an output current of DC/DC converter 40. L denotes inductance of inductor 46 included in DC/DC converter 40. Expression 2 above allows obtaining a relationship between the output voltage Vdc of AC/DC converter 20 and the forward voltage Vf of an LED in the case where the switching frequency fsw is constant.

Figure 5:
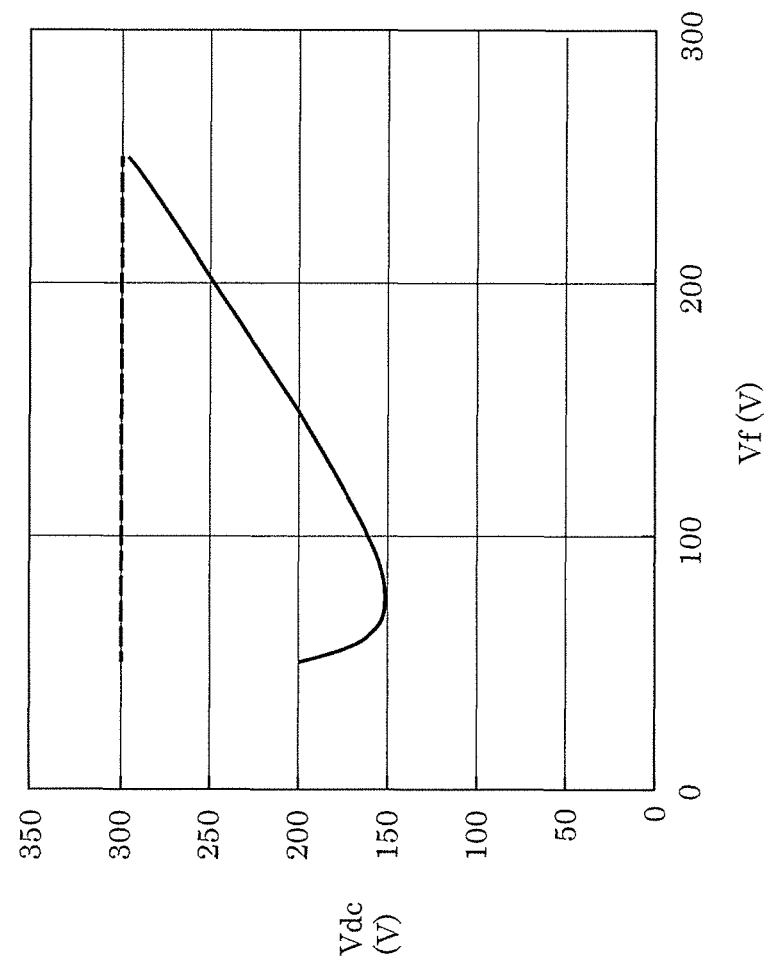
FIG. 5 is a graph illustrating a relationship between an output voltage Vdc of the AC/DC converter and a forward voltage Vf of an LED in the case where a switching frequency of a switching element included in the DC/DC converter according to Embodiment 1 is constant.

FIG. 5 is a graph illustrating a relationship between an output voltage Vdc of AC/DC converter 20 and a forward voltage Vf of an LED in the case where a switching frequency fsw of switching element 44 included in DC/DC converter 40 is constant. In FIG. 5, the solid line indicates the relationship between the output voltage Vdc and the forward voltage Vf where the inductance L is 250 μH, the output current Iout is 1 A, and the switching frequency fsw is 75 kHz. FIG. 5 also indicates, by the broken line, a relationship between the output voltage Vdc and the forward voltage Vf (a relationship in which the forward voltage Vf is 50 V to 250 V and the output voltage Vdc is constant at 300 V) in a comparison example described later.

In the example indicated by the solid line in FIG. 5, the output voltage Vdc negatively correlates with the forward voltage Vf when the forward voltage Vf is lower than 75 V, and positively correlates with the forward voltage Vf when the forward voltage Vf is higher than 75 V.

In the present embodiment, AC/DC control circuit 21 adjusts the output voltage Vdc depending on the forward voltage Vf to make the output voltage Vdc and the forward voltage Vf satisfy the relationship represented by Expression 2 above (the relationship indicated by the solid line in FIG. 5).

Here, description will be provided on the operation of adjusting the output voltage Vdc performed by AC/DC converter 20, with reference to FIG. 1 and FIG. 3.

When LED 14 is connected to DC/DC converter 40, a forward voltage Vf defined by characteristics of LED 14 is applied to LED 14. This forward voltage Vf is detected by detection circuit 30, and provided to terminal Vf of AC/DC control circuit 21 as indicated in FIG. 1. The forward voltage Vf provided to terminal Vf is divided by AC/DC control circuit 21 as indicated in FIG. 3, and the divided voltage Vf1 is provided to reference voltage generating unit 200. Then, reference voltage generating unit 200 generates a reference voltage Vref1 based on the voltage Vf1 provided. Meanwhile, as indicated in FIG. 1, the output voltage Vdc of AC/DC converter 20 is provided to terminal Vdc of AC/DC control circuit 21. The output voltage Vdc provided to terminal Vdc is divided by AC/DC control circuit 21 as indicated in FIG. 3. Here, the reference voltage Vref1 is a voltage to be a target value for the voltage Vdc1 obtained by dividing the output voltage Vdc. In the present embodiment, the reference voltage Vref1 which is the target value for the voltage Vdc1 is generated to make the output voltage Vdc and the forward voltage Vf satisfy the relationship in Expression 2 above. Then, the generated reference voltage Vref1 and the voltage Vdc1 are provided to error amplifier 205. As a result, a voltage Vcomp corresponding to the difference between the reference voltage Vref1 and the voltage Vdc1 is output from error amplifier 205 to which the reference voltage Vref1 and the voltage Vdc1 are provided.

The voltage Vcomp output from error amplifier 205 is provided to PWM control unit 210. PWM control unit 210 outputs a reset signal to a terminal reset (R) of flip-flop 220, after the signal provided from terminal notQ of flip-flop 220 to PWM control unit 210 turns to low-level and then a predetermined period, which is proportional to the voltage Vcomp, elapses. The signal provided from terminal notQ of flip-flop 220 to PWM control unit 210 turns to low-level at a timing when the zero current of inductor 24 of AC/DC converter 20 is detected. Accordingly, a high-level signal is output from terminal Q of flip-flop 220 from the timing when the zero current of inductor 24 is detected until the period proportional to the voltage Vcomp elapses.

As described above, adjustment is performed on the time period during which the high-level signal for turning switching element 25 to the ON state is output from terminal Q of flip-flop 220.

Next, description is provided on a principle of adjustment operation on the output voltage Vdc according to the ON time of switching element 25 performed by AC/DC converter 20.

When the switching of switching element 25 is controlled in the above-described manner, in the ON time of switching element 25, a current flows from inductor 24 to switching element 25 and energy is accumulated in inductor 24. Furthermore, when the reset signal is provided from PWM control unit 210 to terminal reset of flip-flop 220, a low-level signal is output from terminal Q of flip-flop 220, and thus switching element 25 is turned to OFF state. When switching element 25 is turned to OFF state, the energy accumulated in inductor 24 in the ON time of switching element 25 is released via diode 26 and output to DC/DC converter 40. Here, the energy varies depending on the length of ON time of switching element 24, which makes the output voltage Vdc of AC/DC converter 20 be a voltage corresponding to the length of the ON time. When the energy accumulated in inductor 24 is released and the current flowing through inductor 24 reaches zero, the voltage to be applied to terminal ZCD1 reaches zero. When the voltage to be applied to terminal ZCD1 reaches zero, logical negation circuit 211 provides a high-level signal to a terminal set (S) of flip-flop 220. This causes a high-level signal to be outputted from terminal Q of flip-flop 220, and thus switching element 25 is turned to the ON state. Furthermore, the signal to be output from terminal notQ becomes low-level.

By adjusting the ON time of switching element 25 in the above-described manner, the output voltage Vdc of AC/DC converter 20 is adjusted. Then, the output voltage Vdc after the adjustment is provided to AC/DC control circuit 21 again, and the voltage Vdc1 obtained by dividing the output voltage Vdc and the reference voltage Vref1 are provided to error amplifier 205.

By repeating the above-described operation, the voltage Vdc1 obtained by dividing the output voltage Vdc becomes approximately equal to the reference voltage Vref1.

As described above, AC/DC converter 20 can adjust the output voltage Vdc to make the output voltage Vdc and the forward voltage Vf satisfy the relationship represented by Expression 2 above. Thus, with lighting apparatus 10 according to the present embodiment, the switching frequency fsw of switching element 44 included in DC/DC converter 40 can be approximately constant regardless of the variation in the forward voltage Vf.

Figure 6:
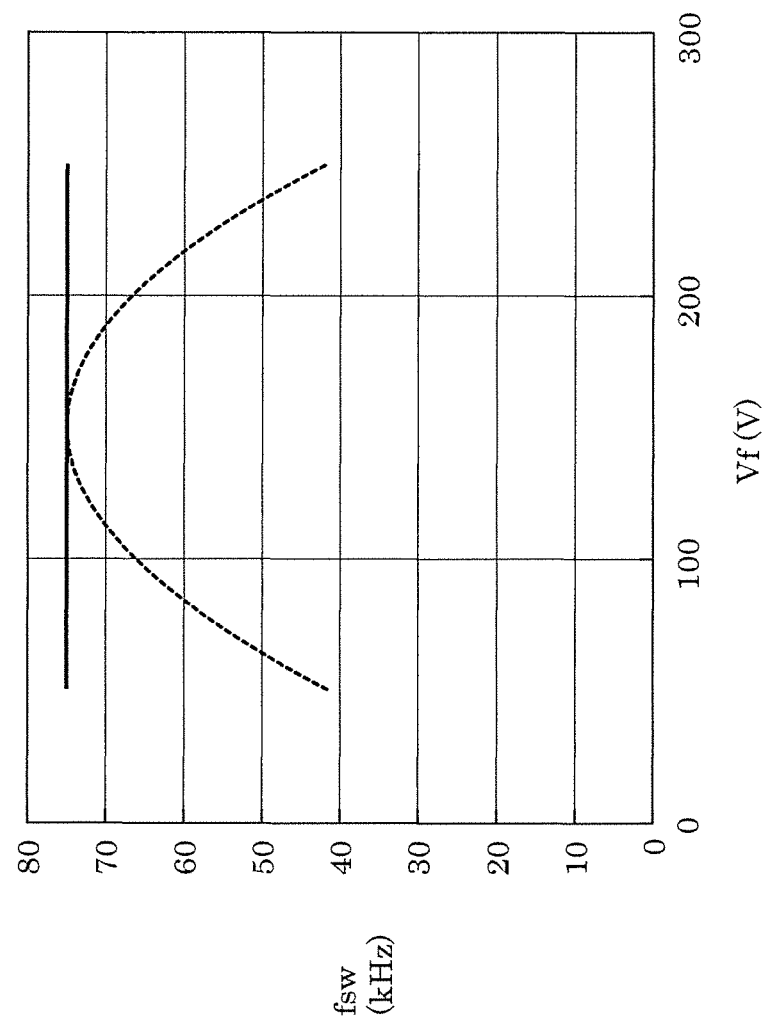
FIG. 6 is a graph illustrating a relationship between the switching frequency fsw of the DC/DC converter of the lighting apparatus according to Embodiment 1 and a forward voltage Vf of an LED.

Description will be provided on a variation range of the switching frequency fsw of DC/DC converter 40 according to the present embodiment, with reference to FIG. 6.

FIG. 6 is a graph illustrating a relationship between the switching frequency fsw of DC/DC converter 40 of lighting apparatus 10 according to the present embodiment and a forward voltage Vf of LED 14. In FIG. 6, the graph indicated by the solid line indicates the relationship between the switching frequency fsw and the forward voltage Vf according to the present embodiment, and the graph indicated by the broken line indicates a relationship between the switching frequency fsw of the lighting apparatus according to the comparison example and the forward voltage Vf. It is to be noted that, in the present embodiment, the inductance L of inductor 46 is 250 µH, the output current Iout is 1 A, and the target switching frequency fsw is 75 kHz. The lighting apparatus according to the comparison example is also a lighting apparatus including an AC/DC converter and a DC/DC converter, in the same manner as in lighting apparatus 10 according to the present embodiment. However, the output voltage Vdc of the AC/DC converter included in the lighting apparatus according to the comparison example is fixed to 300V (see FIG. 5). Furthermore, the inductance L of inductor 46 is 500 µH, and the output current Iout is 1 A, of the DC/DC converter.

As illustrated in FIG. 6, in the lighting apparatus according to the comparison example, the switching frequency fsw varies within a range between 41 kHz and 75 kHz, depending on the forward voltage Vf. Meanwhile, in lighting apparatus 10 according to the present embodiment, the switching frequency fsw is constant at 75 kHz.

It is to be noted that in lighting apparatus 10 according to the present embodiment, the switching frequency fsw is set to a frequency higher than a first frequency. The first frequency can be set as a frequency higher than or equal to an upper limit audible frequency (approximately 20 kHz), for example. Here, the first frequency defines a cut-off frequency of noise filter 70 allowed in lighting apparatus 10. Specifically, noise filter 70 is configured to have a cut-off frequency lower than or equal to the first frequency. In addition, since the size of each of the elements included in noise filter 70 has to be enlarged to lower the cut-off frequency of noise filter 70, the first frequency may be determined based on the size of noise filter 70 which can be contained in lighting apparatus 10.

Furthermore, in the present embodiment, the switching frequency fsw is set to be lower than or equal to a second frequency. Here, the second frequency can be set as a maximum value of the right-hand side of Expression 1 above, for example.

[1-4. Advantageous Effect and Others]

As described above, lighting apparatus 10 according to the present embodiment includes AC/DC converter 20, and DC/DC converter 40 which converts an output voltage of AC/DC converter 20 and applies, to a solid-state light-emitting device, the output voltage converted. Furthermore, DC/DC converter 40 includes switching element 44, and DC/DC control circuit 41 which performs a control of repeatedly turning ON and OFF switching element 44 in BCM. In addition, AC/DC converter 20 adjusts the output voltage Vdc to make the switching frequency fsw of switching element 44 higher than the first frequency, based on the forward voltage Vf to be applied to the solid-state light-emitting device.

With this, the variation of the switching frequency fsw of DC/DC converter 40 of lighting apparatus 10 can be suppressed within a frequency band higher than the first frequency. Accordingly, a frequency of a switching noise generated from lighting apparatus 10 is limited to a frequency higher than the first frequency, and thus the cut-off frequency of noise filter 70 can be higher than the first frequency. Accordingly, the size of noise filter 70 can be within a range corresponding to the first frequency.

Furthermore, in lighting apparatus 10 according to the present embodiment, the first frequency may be higher than or equal to the upper limit audible frequency.

With this, the sounding of lighting apparatus 10 can be suppressed.

Furthermore, in lighting apparatus 10 according to the present embodiment, AC/DC converter 20 adjusts the output voltage Vdc to make the switching frequency fsw of switching element 44 lower than or equal to the second frequency.

With this, the switching loss of switching element 44 of DC/DC converter 40 can be suppressed.

Furthermore, in lighting apparatus 10 according to the present embodiment, when the forward voltage Vf is higher than a predetermined voltage, AC/DC converter 20 adjusts the output voltage Vdc to positively correlate the output voltage Vdc with the forward voltage Vf. Furthermore, when the forward voltage Vf is lower than or equal to the predetermined voltage, AC/DC converter 20 adjusts the output voltage Vdc to negatively correlate the output voltage Vdc with the forward voltage Vf.

With this, the variation of the switching frequency fsw of DC/DC converter 40 of lighting apparatus 10 can be further suppressed. This narrows a range of frequency bands of switching noise, and thus narrows frequency bands for suppressing noise required for noise filter 70. Accordingly, the size of noise filter 70 can be further reduced.

Embodiment 2

Next, a lighting apparatus according to Embodiment 2 will be described.

In lighting apparatus 10 according to Embodiment 1 above, the output voltage Vdc is adjusted to make the output voltage Vdc of AC/DC converter 20 and the forward voltage Vf of an LED satisfy the relationship in Expression 2 above. In the present embodiment, the output voltage Vdc is adjusted to make the output voltage Vdc and the forward voltage Vf have a relationship close to the relationship represented by Expression 2 above, though the relationship in Expression 2 is not completely satisfied. With this, in the present embodiment, the configuration of the AC/DC control circuit can be simplified. Hereinafter, description is provided on the reference voltage generating unit of the AC/DC control circuit which is the difference between the present embodiment and Embodiment 1 above. Description on the lighting apparatus and other elements of the present embodiment is omitted.

[2-1. Reference Voltage Generating Unit]

First, the reference voltage generating unit according to the present embodiment will be described.

In the same manner as in reference voltage generating unit 200 according to Embodiment 1 above, the reference voltage generating unit according to the present embodiment outputs a reference voltage which is a target value for a voltage Vdc1 obtained by dividing the output voltage Vdc of the AC/DC converter, based on a voltage Vf1 obtained by dividing the forward voltage Vf. However, as described abode, the reference voltage is generated to make the output voltage Vdc and the forward voltage Vf have a relationship close to the relationship represented by Expression 2 above, according to the present embodiment. Here, description is provided on the relationship between the output voltage Vdc and the forward voltage Vf according to the present embodiment.

Figure 7:
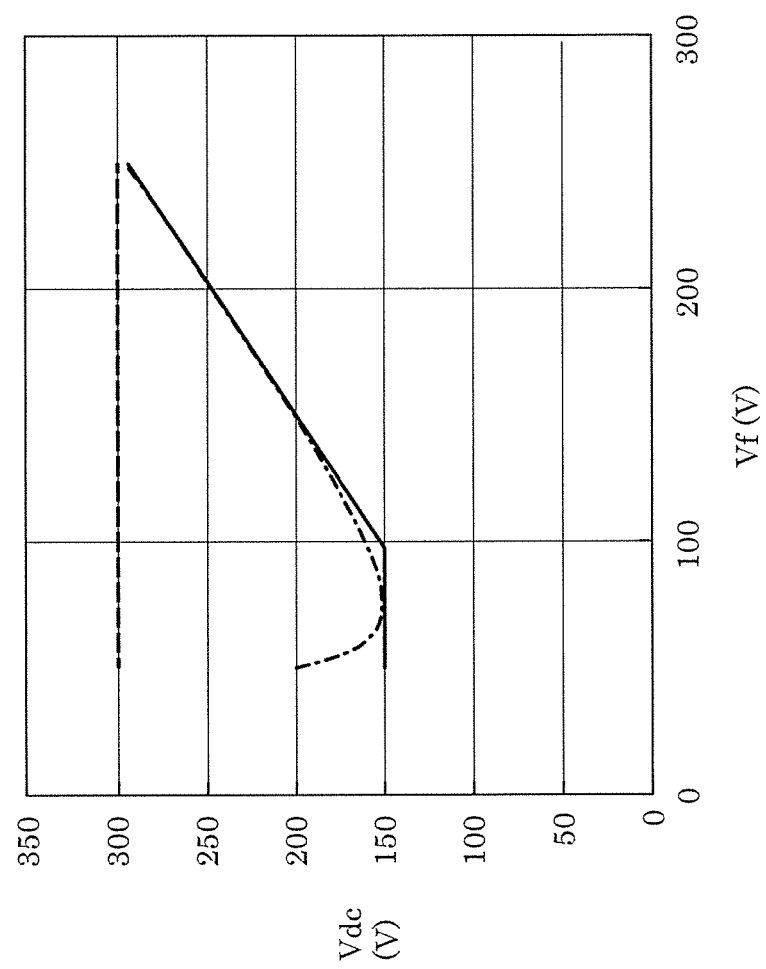
FIG. 7 is a graph illustrating a relationship between an output voltage Vdc of an AC/DC converter of a lighting apparatus according to Embodiment 2 and a forward voltage Vf of an LED.

FIG. 7 is a graph illustrating a relationship between an output voltage Vdc of an AC/DC converter of a lighting apparatus according to the present embodiment and a forward voltage Vf of an LED. In FIG. 7, the solid line indicates a graph indicating the relationship between the output voltage Vdc and the forward voltage Vf according to the present embodiment, and the long dashed short dashed line indicates a graph indicating the relationship between the output voltage Vdc according to Embodiment 1 and the forward voltage Vf for reference. Furthermore, the broken line in FIG. 7 indicates the relationship between the output voltage Vdc and the forward voltage Vf in the comparison example above.

As illustrated in FIG. 7, the output voltage Vdc of the lighting apparatus according to the present embodiment and the forward voltage Vf of the LED have a relationship (see the solid line in FIG. 7) close to the relationship represented by Expression 2 above (see the long dashed short dashed line in FIG. 7). The AC/DC converter according to the present embodiment adjusts the output voltage Vdc to positively correlate the output voltage Vdc with the forward voltage Vf when the forward voltage Vf is higher than a predetermined voltage (100 V). Furthermore, the AC/DC converter according to the present embodiment keeps the output voltage Vdc constant (150 V) when the forward voltage Vf is lower than or equal to the predetermined voltage (100 V).

Next, description is provided on a configuration of the reference voltage generating unit for obtaining the relationship between the output voltage Vdc and the forward voltage Vf as indicated in FIG. 7.

Figure 8:
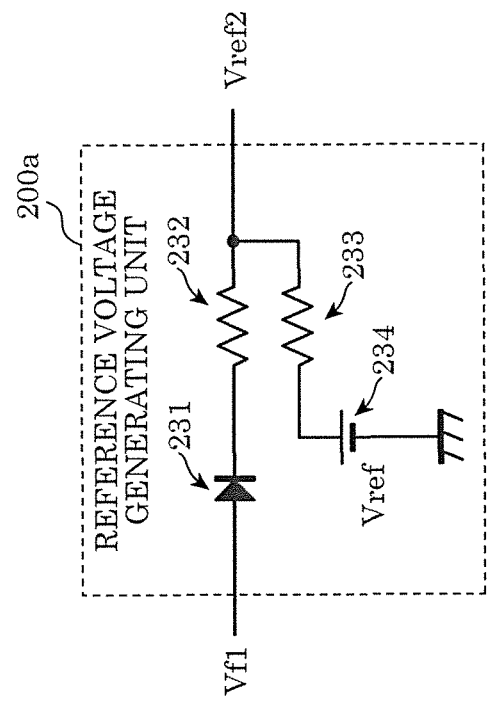
FIG. 8 is a circuit diagram illustrating a circuit configuration of a reference voltage generating unit according to Embodiment 2.

FIG. 8 is a circuit diagram illustrating a circuit configuration of the reference voltage generating unit according to the present embodiment.

As illustrated in FIG. 8, reference voltage generating unit 200a according to the present embodiment generates a reference voltage Vref2 based on a voltage Vf1 obtained by dividing the forward voltage Vf and outputs the reference voltage Vref2 to error amplifier 205. Furthermore, reference voltage generating unit 200a includes diode 231, resistors 232 and 233, and voltage source 234, as illustrated in FIG. 8. Here, voltage source 234 is a constant-voltage source which outputs a constant voltage Vref.

Hereinafter, description is provided on an operation performed by reference voltage generating unit 200a illustrated in FIG. 8.

When the voltage Vf1 obtained by dividing the forward voltage Vf is lower than the voltage Vref output from voltage source 234, diode 231 is not in the conduction state, and thus the reference voltage Vref2 is equal to the voltage Vref output from voltage source 234. Meanwhile, when the voltage Vf1 is higher than the voltage Vref output from voltage source 234, diode 231 is in the conduction state, and thus the reference voltage Vref2 is a voltage obtained by adding a bias voltage corresponding to the magnitude of the voltage Vf1 to the voltage Vref output from voltage source 234. With this, the relationship between the output voltage Vdc and the forward voltage Vf as indicated in FIG. 7 can be obtained.

Figure 9:
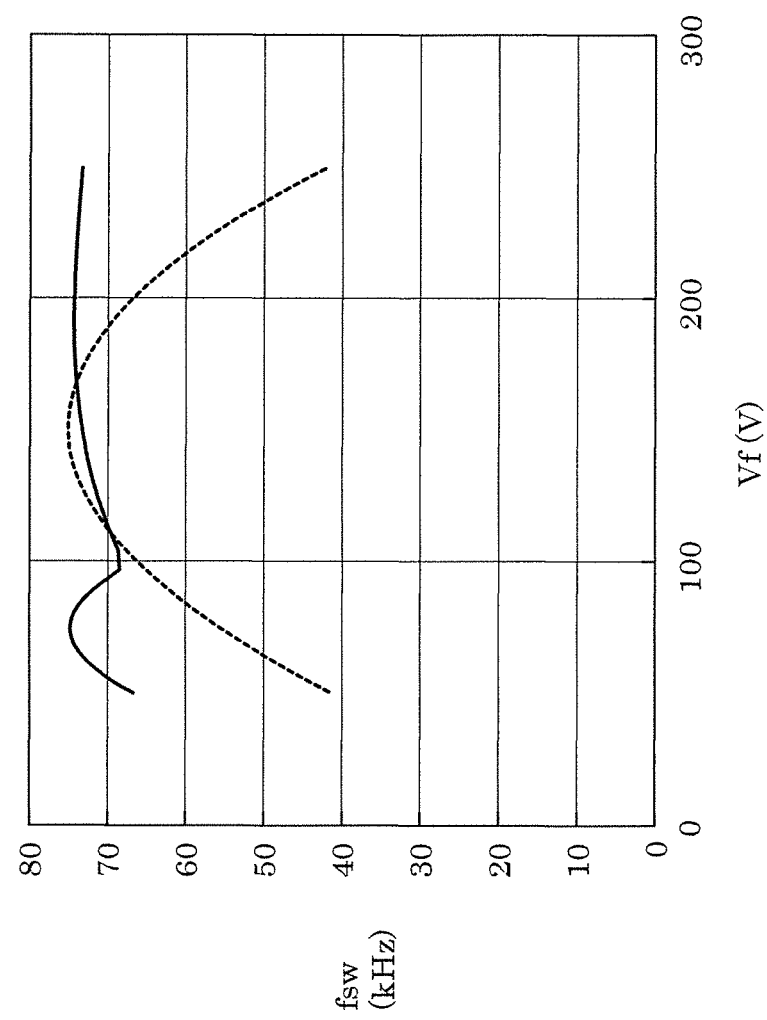
FIG. 9 is a graph illustrating a relationship between a switching frequency fsw of a DC/DC converter of the lighting apparatus according to Embodiment 2 and a forward voltage Vf of an LED.

Description will be provided on a variation range of the switching frequency fsw of the DC/DC converter according to the present embodiment, with reference to FIG. 9.

FIG. 9 is a graph indicating a relationship between a switching frequency fsw of the DC/DC converter of the lighting apparatus according to the present embodiment and a forward voltage Vf of LED 14. In FIG. 9, the solid line indicates a graph indicating a relationship between the forward voltage Vf and the switching frequency fsw according to the present embodiment, and the broken line indicates a graph indicating a relationship between the forward voltage Vf and the switching frequency fsw according to the comparison example. It is to be noted that the parameters in the present embodiment are the same values as the parameters according to Embodiment 1 above. Furthermore, the comparison example indicated by the broken line in FIG. 9 is the same as that in the comparison example indicated in FIG. 6.

As illustrated in FIG. 9, the lighting apparatus according to the present embodiment suppresses the variation range of the switching frequency fsw further than in the comparison example. Furthermore, the switching frequency fsw has a frequency higher than the audible frequency.

[2-2. Advantageous Effect and Others]

As described above, in the lighting apparatus according to the present embodiment, when the forward voltage Vf is higher than a predetermined voltage, the AC/DC converter adjusts the output voltage Vdc to positively correlate the output voltage Vdc with the forward voltage Vf. Furthermore, when the forward voltage Vf is lower than or equal to a predetermined voltage, the AC/DC converter keeps the output voltage Vdc constant.

With this, the variation range of the switching frequency fsw can be further suppressed as compared with the case where the output voltage Vdc of the AC/DC converter is fixed. Furthermore, with the present embodiment, the circuit configuration for adjusting the Vdc can be simplified.

Embodiment 3

Next, a lighting apparatus according to Embodiment 3 will be described.

Here, an example is indicated which shows that the configuration of the AC/DC control circuit can be further simplified than in Embodiment 2 above. Hereinafter, description is provided on the reference voltage generating unit of the AC/DC control circuit which is the difference between the present embodiment and each of the above-described embodiments. Description on the lighting apparatus and other elements in the present embodiment is omitted.

[3-1. Reference Voltage Generating Unit]

First, the reference voltage generating unit according to the present embodiment will be described.

In the same manner as in reference voltage generating unit 200a according to Embodiment 2 above, the reference voltage generating unit according to the present embodiment generates a reference voltage to make the forward voltage Vf and the output voltage Vdc have a relationship close to the relationship in Expression 2 above. Here, description is provided on the relationship between the output voltage Vdc and the forward voltage Vf according to the present embodiment.

Figure 10:
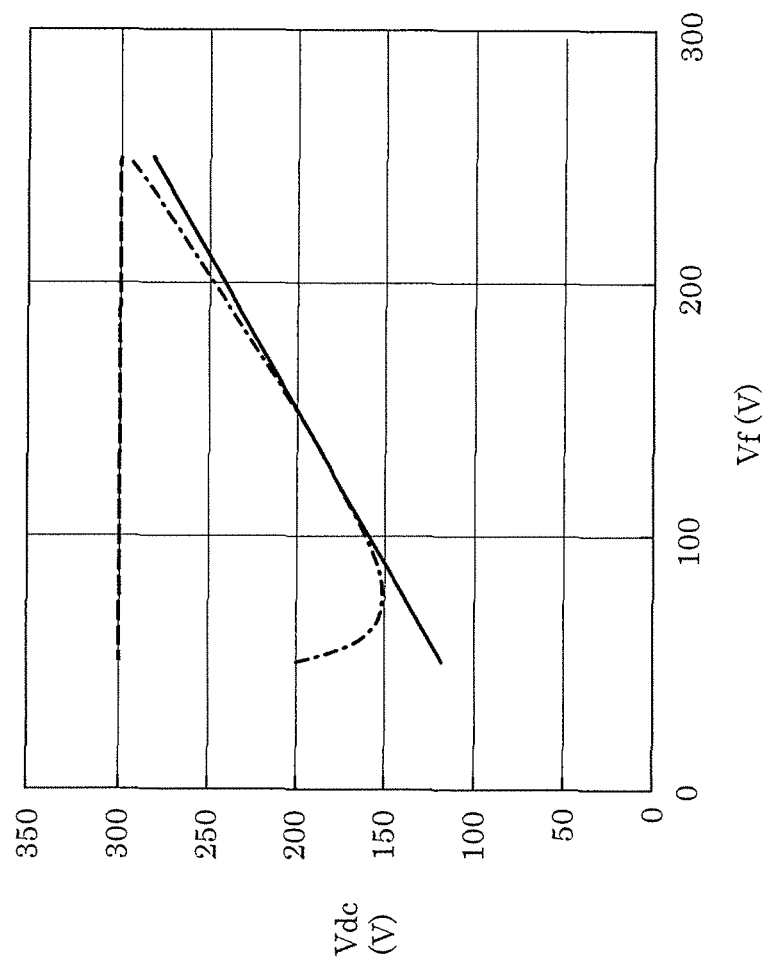
FIG. 10 is a graph illustrating a relationship between an output voltage Vdc of an AC/DC converter of a lighting apparatus according to Embodiment 3 and a forward voltage Vf of an LED.

FIG. 10 is a graph illustrating a relationship between an output voltage Vdc of an AC/DC converter of a lighting apparatus according to the present embodiment and a forward voltage Vf of an LED. In FIG. 10, the solid line indicates a graph indicating the relationship between the output voltage Vdc according to the present embodiment and the forward voltage Vf, and the long dashed short dashed line indicates a graph indicating the relationship between the output voltage Vdc according to Embodiment 1 and the forward voltage Vf for reference. Furthermore, the broken line in FIG. 10 indicates the relationship between the output voltage Vdc in the comparison example above and the forward voltage Vf.

As illustrated in FIG. 10, the output voltage Vdc of the lighting apparatus according to the present embodiment and the forward voltage Vf of the LED have a relationship (see the solid line in FIG. 10) close to the relationship represented by Expression 2 above (see the long dashed short dashed line in FIG. 10). The AC/DC converter according to the present embodiment adjusts the output voltage Vdc to positively correlate the output voltage Vdc with the forward voltage Vf.

Next, description is provided on a configuration of the reference voltage generating unit for obtaining the relationship between the output voltage Vdc and the forward voltage Vf as indicated in FIG. 10.

Figure 11:
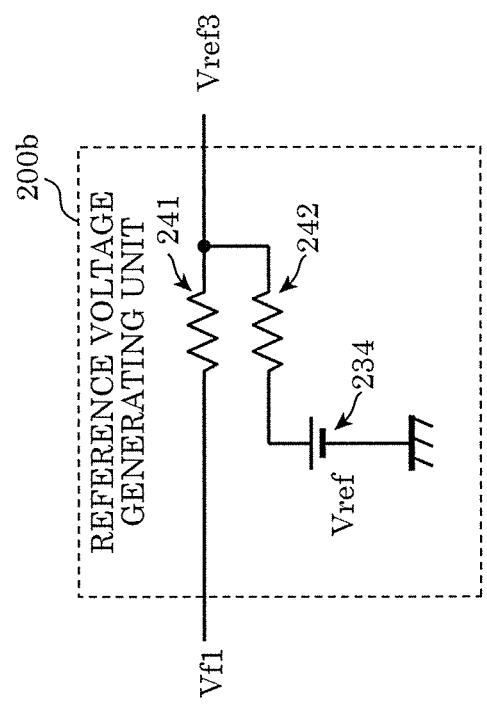
FIG. 11 is a circuit diagram illustrating a circuit configuration of a reference voltage generating unit according to Embodiment 3.

FIG. 11 is a circuit diagram illustrating a circuit configuration of the reference voltage generating unit according to the present embodiment.

As illustrated in FIG. 11, reference voltage generating unit 200b according to the present embodiment generates a reference voltage Vref3 based on a voltage Vf1 obtained by dividing the forward voltage Vf and outputs the reference voltage Vref3 to error amplifier 205. Furthermore, reference voltage generating unit 200b includes resistors 241 and 242 and voltage source 234, as illustrated in FIG. 11. Here, voltage source 234 is a constant-voltage source which outputs a constant voltage Vref.

Hereinafter, description is provided on an operation performed by reference voltage generating unit 200b illustrated in FIG. 11.

When the voltage Vf1 obtained by dividing the forward voltage Vf is provided to reference voltage generating unit 200b, the reference voltage Vref3 becomes a voltage obtained by adding a bias voltage corresponding to the magnitude of the voltage Vf1 to the voltage Vref output from voltage source 234. With this, the relationship between the output voltage Vdc and the forward voltage Vf as illustrated in FIG. 10 can be obtained.

Figure 12:
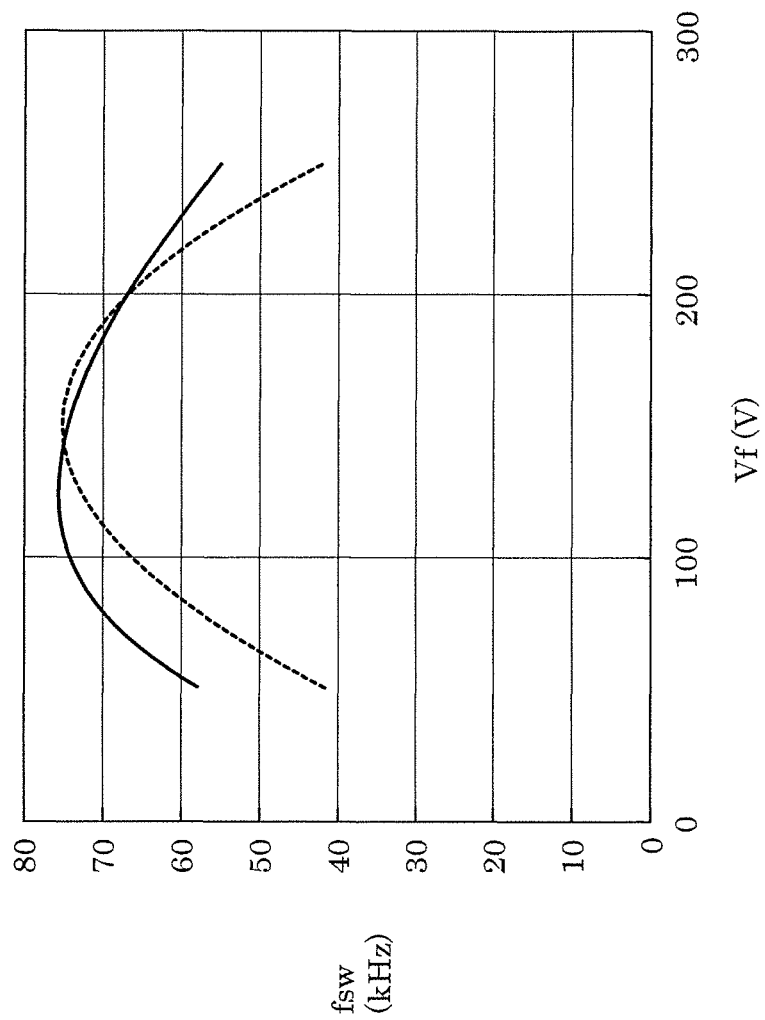
FIG. 12 is a graph illustrating a relationship between a switching frequency fsw of a DC/DC converter of the lighting apparatus according to Embodiment 3 and a forward voltage Vf of an LED.

Description will be provided on a variation range of the switching frequency fsw of a DC/DC converter according to the present embodiment, with reference to FIG. 12.

FIG. 12 is a graph indicating a relationship between a switching frequency fsw of the DC/DC converter of the lighting apparatus according to the present embodiment and a forward voltage Vf of LED 14. In FIG. 12, the solid line indicates a graph indicating a relationship between the switching frequency fsw and the forward voltage Vf according to the present embodiment, and the broken line indicates a graph indicating a relationship between the forward voltage Vf and the switching frequency fsw according to the comparison example. It is to be noted that the parameters in the present embodiment are the same values as the parameters according to Embodiment 1 above. Furthermore, the comparison example indicated by the broken line in FIG. 12 is the same as those in the comparison examples indicated in FIG. 6 and FIG. 9.

As illustrated in FIG. 12, the lighting apparatus according to the present embodiment further suppresses the variation range of the switching frequency fsw than in the comparison example. Furthermore, the switching frequency fsw has a frequency higher than the audible frequency.

[3-2. Advantageous Effect and Others]

As described above, in the lighting apparatus according to the present embodiment, the AC/DC converter adjusts the output voltage Vdc to positively correlate the output voltage Vdc with the forward voltage Vf.

With this, the variation range of the switching frequency fsw can be further suppressed as compared with the case where the output voltage Vdc of the AC/DC converter is fixed. Furthermore, with the present embodiment, the circuit configuration for adjusting Vdc can be further simplified.

Embodiment 4

Next, a luminaire according to Embodiment 4 will be described.

Figure 13:
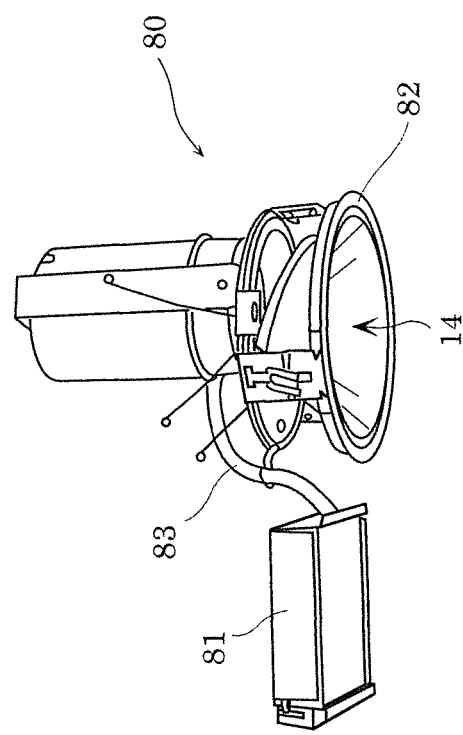
FIG. 13 is an external view of a luminaire according to Embodiment 4.

FIG. 13 is an external view of luminaire 80 according to the present embodiment. Luminaire 80 includes any one of the lighting apparatuses according to Embodiments 1 to 3 described above, and LED 14 which receives a current supplied from the lighting apparatus. According to the present embodiment, luminaire 80 is a downlight including: circuit box 81 which houses the lighting apparatus; lighting body 82 to which LED 14 is attached; and line 83 electrically connecting circuit box 81 and LED 14 of lighting body 82.

Luminaire 80 as described above includes one of lighting apparatuses according to Embodiments 1 to 3 described above, and therefore variation of the switching frequency caused by the variation of the forward voltage of LED 14 can be suppressed.

(Modifications and Others)

The lighting apparatus and the luminaire according to the present disclosure have been described based on Embodiments 1 to 4, however the present disclosure is not limited to the above-described embodiments. Other forms in which various modifications apparent to those skilled in the art are applied to the embodiment, or forms structured by combining elements of different embodiments are included within the scope of the present disclosure, unless such changes and modifications depart from the scope of the present disclosure.

For example, although an LED is employed as an example of a solid-state light-emitting device in Embodiments 1 to 4 described above, the solid-state light-emitting device is not limited to an LED, and may be a solid-state light-emitting device of a different type such as an organic EL (organic electro-luminescence) device.

In addition, a solid-state light-emitting device is not limited to a single LED, and a plurality of LEDs may be included. The plurality of LEDs may be connected in series, in parallel, or in a mixed manner thereof, may be a module in which a plurality of LED chips are connected, or may be a plurality of modules.

Furthermore, the AC/DC converter according to Embodiments 1 to 4 described above is not limited to a boost converter, and may be a converter of a different type such as a buck converter, a buck-boost converter, or a flyback converter.

Furthermore, the operation performed by the AC/DC converter according to Embodiments 1 to 4 described above is not limited to a BCM operation, and may be a DCM (Discontinuous Current Mode) operation or a CCM (Continuous Current Mode) operation.

Furthermore, another DC power supply circuit capable of adjusting the output voltage may be employed instead of the AC/DC converter according to Embodiments 1 to 4 described above.

Furthermore, the DC/DC converter according to Embodiments 1 to 4 described above is not limited to a buck converter, and may be a converter of a different type such as a buck-boost converter, a flyback converter, and a boost converter.

Furthermore, the output voltage Vdc of the AC/DC converter is not necessarily controlled to be temporally constant. For example, a peak frequency of a noise can be dispersed by varying the output voltage Vdc at a frequency lower than the switching frequency fsw of the DC/DC converter to cause the switching frequency fsw to vary temporally.

While the foregoing has described what are considered to be the best mode and/or other examples, it is understood that various modifications may be made therein and that the subject matter disclosed herein may be implemented in various forms and examples, and that they may be applied in numerous applications, only some of which have been described herein. It is intended by the following claims to claim any and all modifications and variations that fall within the true scope of the present teachings.

What is claimed is:

1. A lighting apparatus which supplies a current to a solid-state light-emitting device, the lighting apparatus comprising:
    a direct-current (DC) power supply circuit; and
    a DC/DC converter that converts an output voltage of the DC power supply circuit to a converted output voltage and applies the converted output voltage to the solid-state light-emitting device,
    wherein the DC/DC converter includes a switching element, and a control circuit that performs a control of repeatedly turning ON and OFF the switching element in a boundary conduction mode, and
    the DC power supply circuit includes a reference voltage generating unit which generates a reference voltage based on a forward voltage applied to the solid-state light-emitting device to adjust the output voltage of the DC power supply circuit to make a switching frequency of the switching element higher than or equal to an upper limit of audible frequency and lower than or equal to 75 kHz.

2. The lighting apparatus according to claim 1, wherein the DC power supply circuit adjusts the output voltage of the DC power supply circuit to positively correlate the output voltage of the DC power supply circuit with the forward voltage.

3. The lighting apparatus according to claim 1, wherein the DC power supply circuit adjusts the output voltage of the DC power supply circuit so that a range of a value of the forward voltage is present in which the output voltage of the DC power supply circuit is kept constant with respect to a variation in the value of the forward voltage, and adjusts the output voltage of the DC power supply circuit to positively correlate the output voltage of the DC power supply circuit with the forward voltage in a value of the forward voltage higher than the value of the forward voltage in the range.

4. The lighting apparatus according to claim 1, wherein the DC power supply circuit adjusts the output voltage of the DC power supply circuit so that a range of a value of the forward voltage is present in which the output voltage of the DC power supply circuit is negatively correlated with the forward voltage, and adjusts the output voltage of the DC power supply circuit to positively correlate the output voltage of the DC power supply circuit with the forward voltage in a value of the forward voltage higher than the value of the forward voltage in the range.

5. A luminaire comprising:
    the lighting apparatus according to claim 1; and
    a solid-state light-emitting device that receives a current supplied from the lighting apparatus.

6. The lighting apparatus according to claim 1, wherein the DC power supply circuit adjusts the output voltage of the DC power supply circuit to keep the switching frequency constant.

* * * * *